United States Patent
Bhat et al.

(10) Patent No.: US 10,310,040 B2
(45) Date of Patent: Jun. 4, 2019

(54) METHOD AND MAGNETIC RESONANCE APPARATUS FOR SIMULTANEOUS MULTI-CONTRAST TURBO SPIN ECHO IMAGING

(71) Applicant: Siemens Healthcare GmbH, Erlangen (DE)

(72) Inventors: Himanshu Bhat, Newton, MA (US); Pedro Miguel Itriago Leon, Caracas (VE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 270 days.

(21) Appl. No.: 15/221,635

(22) Filed: Jul. 28, 2016

(65) Prior Publication Data

US 2018/0031659 A1 Feb. 1, 2018

(51) Int. Cl.
*G01R 33/56* (2006.01)
*G01R 33/483* (2006.01)
*G01R 33/561* (2006.01)

(52) U.S. Cl.
CPC ..... *G01R 33/5602* (2013.01); *G01R 33/4835* (2013.01); *G01R 33/5617* (2013.01); *G01R 33/5611* (2013.01)

(58) Field of Classification Search
CPC ............ G01R 33/4835; G01R 33/5611; G01R 33/543; G01R 33/4828; G01R 33/5617; G01R 33/4822; G01R 33/5602; G01R 33/3852
USPC ........................................................ 324/309
See application file for complete search history.

(56) References Cited

U.S. PATENT DOCUMENTS

| 2012/0083687 A1* | 4/2012 | Parker | A61B 5/024 600/419 |
| 2014/0070803 A1* | 3/2014 | Jin | G01R 33/5605 324/309 |
| 2014/0210471 A1* | 7/2014 | Stemmer | G01R 33/56554 324/309 |

(Continued)

OTHER PUBLICATIONS

Gagoski, Borjan A., et al. "RARE/turbo spin echo imaging with simultaneous multislice Wave—CAIPI." Magnetic resonance in medicine 73.3 (2015): 929-938.*

(Continued)

*Primary Examiner* — Christopher P McAndrew
(74) *Attorney, Agent, or Firm* — Schiff Hardin LLP

(57) ABSTRACT

In a magnetic resonance apparatus and method for acquiring magnetic resonance data, a magnetic resonance data acquisition scanner executes a turbo spin echo (TSE) data acquisition sequence with simultaneous multi-slice (SMS) imaging wherein nuclear spins in two different slices of an examination subject are simultaneously excited so as to produce respective echo trains. The magnetic resonance data acquisition scanner is operated with the SMS imaging configured so that magnetic resonance signals from the respective slices have a different contrast, with the SMS being configured to allow evolution of magnetization of the nuclear spins for the second contrast while magnetic resonance signals with the first contrast are being detected. The respective magnetic resonance signals from the two different slices are detected and entered into an electronic memory organized as k-space, as k-space data.

16 Claims, 9 Drawing Sheets

(56) References Cited

U.S. PATENT DOCUMENTS

| | | | | |
|---|---|---|---|---|
| 2014/0225612 A1* | 8/2014 | Polimeni | G01R 33/4835 | 324/309 |
| 2014/0253120 A1* | 9/2014 | Ugurbil | A61B 5/055 | 324/309 |
| 2015/0022207 A1* | 1/2015 | Meyer | G01R 33/4818 | 324/309 |
| 2015/0077106 A1* | 3/2015 | Kim | G01R 33/4828 | 324/309 |
| 2015/0301136 A1* | 10/2015 | Li | G01R 33/385 | 324/309 |
| 2017/0315202 A1* | 11/2017 | Bhat | G01R 33/5617 | |

OTHER PUBLICATIONS

Downs, Richard Keith, et al. "Quantitative contrast ratio comparison between T1 (TSE at 1.5 T, FLAIR at 3T), magnetization prepared rapid gradient echo and subtraction imaging at 1.5 T and 3T." Quantitative imaging in medicine and surgery 3.3 (2013): 141.*

Jain, Krishan K., et al. "Prevalence of MR imaging abnormalities in vitamin B12 deficiency patients presenting with clinical features of subacute combined degeneration of the spinal cord." Journal of the neurological sciences 342.1 (2014): 162-166.*

Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).

Setsompop et al., "Improving Diffusion MRI Using Simultaneous Multi-Slice Echo Planar Imaging," NeuroImage, vol. 63, pp. 569-580 (2012).

Cauley et al., "Interslice Leakage Artifact Reduction Technique for Simultaneous Multislice Acquisitions," Magnetic Resonance in Medicine, vol. 72, pp. 93-102 (2014).

* cited by examiner

METHOD AND MAGNETIC RESONANCE APPARATUS FOR SIMULTANEOUS MULTI-CONTRAST TURBO SPIN ECHO IMAGING

BACKGROUND OF THE INVENTION

The present invention concerns magnetic resonance (MR) imaging, and in particular concerns simultaneous multi-slice (SMS) MR imaging.

Description of the Prior Art

MR imaging is a widely used imaging modality for medical diagnosis as well as for material inspection.

In a magnetic resonance apparatus, the examination object (a patient, in the case of medical magnetic resonance imaging) is exposed to a strong and constant basic magnetic field, by the operation of a basic field magnet of an MR scanner, in which the examination object is situated. The MR scanner also has a gradient coil arrangement that is operated in order to activate gradient fields that spatially encode the magnetic resonance signals. The magnetic resonance signals are produced by the radiation of radio-frequency (RF) pulses from an RF radiator, such as one or more antennas, in the MR scanner. These RF pulses excite nuclear spins in the examination object, and are therefore often called excitation pulses. The excitation of the nuclear spins at an appropriate frequency gives the excited spins a magnetization that causes the nuclear spins to deviate, by an amount called the flip angle, from the alignment of the nuclear spins that was produced by the basic magnetic field. As the nuclear spins relax, while returning to alignment in the basic magnetic field, they emit MR signals (which are also RF signals), which are received by suitable RF reception antennas in the MR scanner, which may be the same or different from the RF radiator used to emit the excitation pulse.

The emitted MR signals have a signal intensity that is dependent on the exponential decay over time of the magnetization of the nuclear spins. The acquired signals are digitized so as to form raw data, which are entered into a memory that is organized as k-space, as k-space data. Many techniques are known for reconstructing an image of the examination object from the k-space data.

By appropriately selecting different characteristics of the MR data acquisition sequence that is used, the acquired signals can be differently weighted so that different sources of the detected MR signals (i.e., different tissues in the case of medical MR imaging) appear with different contrasts in the reconstructed image. In the case of medical MR imaging, a weighting is selected that causes the tissue that is important for making the intended medical diagnosis to have the best contrast (brightness) in the reconstructed image. One such type of weighting is known as T1-weighting, because it depends on the so-called T1 relaxation time of the nuclear spins.

Many different techniques are known for acquiring the raw MR data. One such technique is known as simultaneous multi-slice (SMS) acquisition, which is a technique for accelerating the acquisition of the data from a given volume of the examination object, wherein nuclear spins in multiple slices are excited simultaneously, and the resulting MR signals are simultaneously acquired from each slice. This results in a dataset in k-space that is composed of data from the multiple slices collapsed on top of each other. Techniques are known for separating or uncollapsing the data for these respective slices during image reconstruction, such as the slice GRAPPA (Generalized Autocalibration Partially Parallel Acquisitions) technique, which is schematically illustrated in FIG. 1. In the example shown in FIG. 1, multiple slices S1, S2 and S3 are excited simultaneously, resulting in each slice generating an echo train of magnetic resonance signals, which are acquired according to the known blipped CAIPIRINHA (Controlled Aliasing in Parallel Imaging Results in Higher Acceleration) technique. Details of such techniques are described, for example, in Setsompop et al., "Blipped-Controlled Aliasing in Parallel Imaging for Simultaneous Multislice Echo Planar Imaging With Reduced g-Factor Penalty," Magnetic Resonance in Medicine, Vol. 67, pp. 1210-1224 (2012) and Setsompop et al., "Improving Diffusion MRI Using Simultaneous Multi-Slice Echo Planar Imaging," NeuroImage, Vol. 63, pp. 569-580 (2012) and Cauley et al., "Interslice Leakage Artifact Reduction Technique for Simultaneous Multislice Acquisitions," Magnetic Resonance in Medicine, Vol. 72, pp. 93-102 (2014).

Excitation of the nuclear spins in the simultaneously acquired slices is implemented with a multi-band (MB) RF pulse. An MB RF pulse is generated by the superimposition of a number of individual single band (SB) RF pulses, of the type that are typically used to excite nuclear spins in a single selected slice in conventional magnetic resonance imaging.

The turbo spin echo (TSE) sequence is the "clinical workhorse" sequence for MR imaging, by virtue of being the most utilized sequence for all types of body region imaging. A TSE sequence has several echo trains, and in each echo train, multiple phase encoding lines of the entirety of k-space are scanned (filled with data) after one excitation pulse. This is achieved by refocusing the spins after each readout line, utilizing refocusing RF pulses. Compared to a conventional spin echo (SE) sequence, the acquisition time in a TSE sequence is reduced by the number of refocused echoes in one echo train. This reduction is known as the turbo factor.

FIG. 9 shows a sequence diagram for one echo train of a conventional TSE sequence, specifically a T1-FLAIR TSE protocol. In this conventional protocol, data are acquired from 15 slices in two concats of 7 and 8 slices respectively, with a turbo factor 7. Dead time 1 and dead time 2 are shown in FIG. 9, following the IR (inversion recovery) pulses for slice 1 and slice 2, and following the echo train.

It is known to combine SMS and TSE, in order to acquire data from two or more slices simultaneously. This reduces the minimum repetition time (TR) which is given by the length of all echo trains for all slices that are executed back-to-back. The reduction occurs because fewer slices must be acquired with such a combination. The total number of reduced slices is known as the slice acceleration factor. For many examinations, however, the minimum TR is not limited by the total time of all echo trains, but instead is limited by the desired image contrast.

Therefore, some TSE protocols are designed so as to intentionally have dead time intervals therein, during which no imaging is performed. For typical examinations, several of these protocols must be used, which increases the total amount of unused (dead) time. One example of a common workflow that is affected by this problem is spine imaging, wherein typically a sagittal T1 dark fluid, as well as a T2 contrast, must be acquired. Realistic settings of the current protocols are 15 slices with TR=2,000 ms, TE=9 ms, turbo factor 6, matrix size 320 for the T1 dark fluid protocol with a dead time of 800 ms per echo train, which results in a total acquisition time of 4 minutes and 38 seconds. Realistic settings for the T2 contrast acquisition are TR=3,500 ms, TE=95 ms, turbo factor 17, matrix size 384 with a dead time of 2,000 ms per echo train, which results in a total acquisition time of 3 minutes and 46 seconds. Because both protocols must be executed consecutively, approximately 50% of the total acquisition time is not used for imaging (i.e., raw data acquisition).

Applying SMS to these known techniques will not result in reduced measurement time, because in that context the use of SMS imaging would only increase the dead time duration, but would not reduce the total acquisition time.

SUMMARY OF THE INVENTION

An object of the present invention is to provide a magnetic resonance imaging method and apparatus wherein SMS imaging can be used in combination with TSE protocols, without the aforementioned disadvantages.

This object is achieved in accordance with the present invention by a magnetic resonance imaging apparatus and method wherein SMS is used in combination with a TSE protocol to enable simultaneous acquisition of two contrasts by interleaving the respective echo trains.

In accordance with the invention, two or more slices of a subject are excited so as to have different contrasts simultaneously, and raw magnetic resonance data with the different contrasts are acquired in two sections of the echo train. The SMS technique is thus used in order to allow evolution of the magnetization for the nuclear spins exhibiting the second contrast, while the raw data exhibiting the first contrast are still being acquired.

The method and apparatus in accordance with the invention use SMS imaging and interleaved echo trains in order to acquire multiple contrasts within one scan. This results in more efficient use of measurement time with raw data representing two contrasts being simultaneously acquired.

DESCRIPTION OF THE PREFERRED EMBODIMENTS

Figure 1:
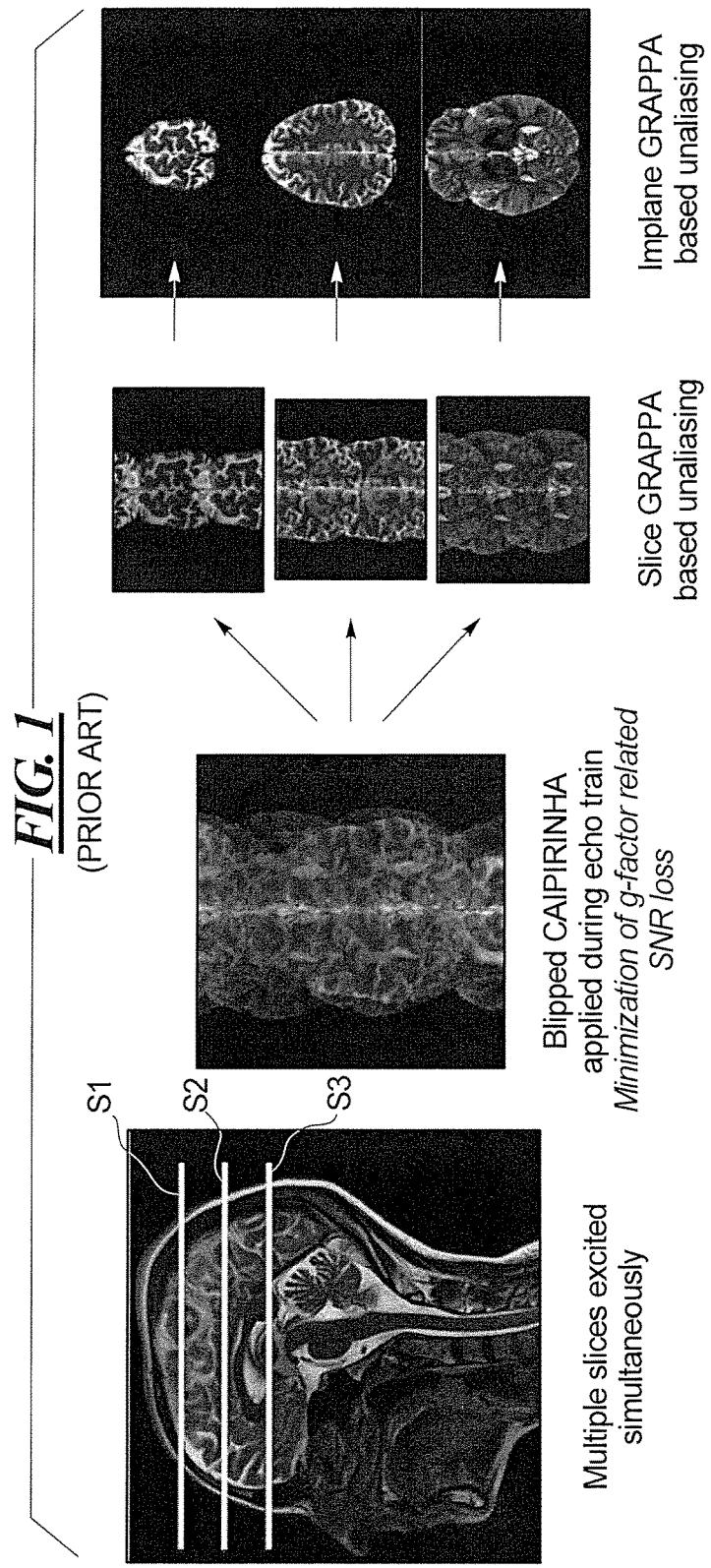
FIG. 1, as noted above, schematically illustrates a conventional SMS acceleration technique.
Figure 2:
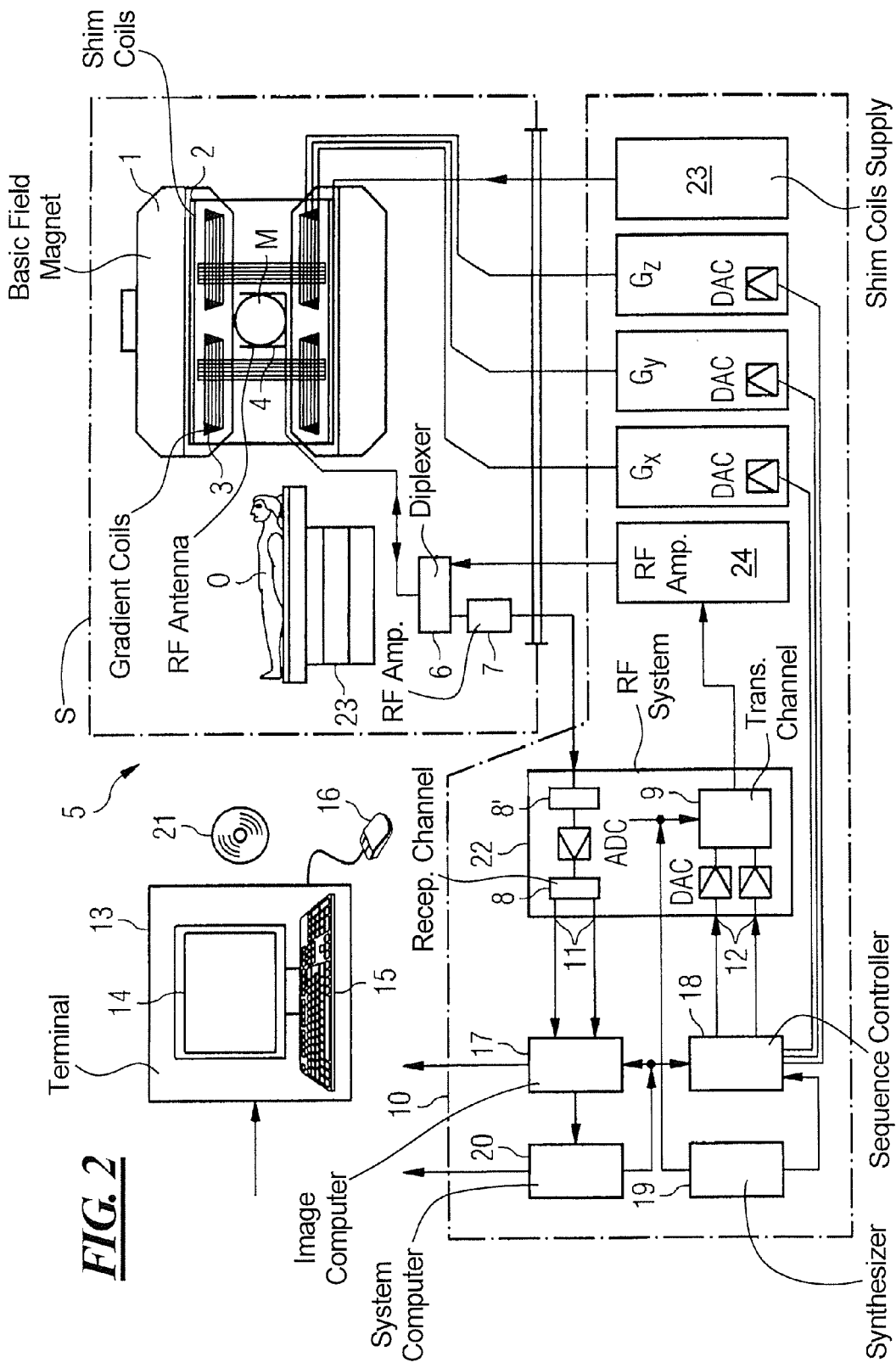
FIG. 2 schematically illustrates a magnetic resonance imaging apparatus constructed and operating in accordance with the present invention.

FIG. 2 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 23 for the shim-coils 2.

A cylindrically shaped gradient coil system 3 is incorporated in the basic field magnet 1, composed of three windings. Each winding is supplied by a corresponding amplifier Gx, Gy and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

In each of FIGS. 3, 4, 5, 6 and 7, where pulses or echoes occur both for slices 1 and 2, they are schematically illustrated in the drawings by two slightly separated waveforms, but this slight separation is only for the purpose of being able to visualize the two waveforms, and the slight separation is not intended to represent any intended or actual time offset, and the waveforms in most instances will be simultaneous.

Figure 3:
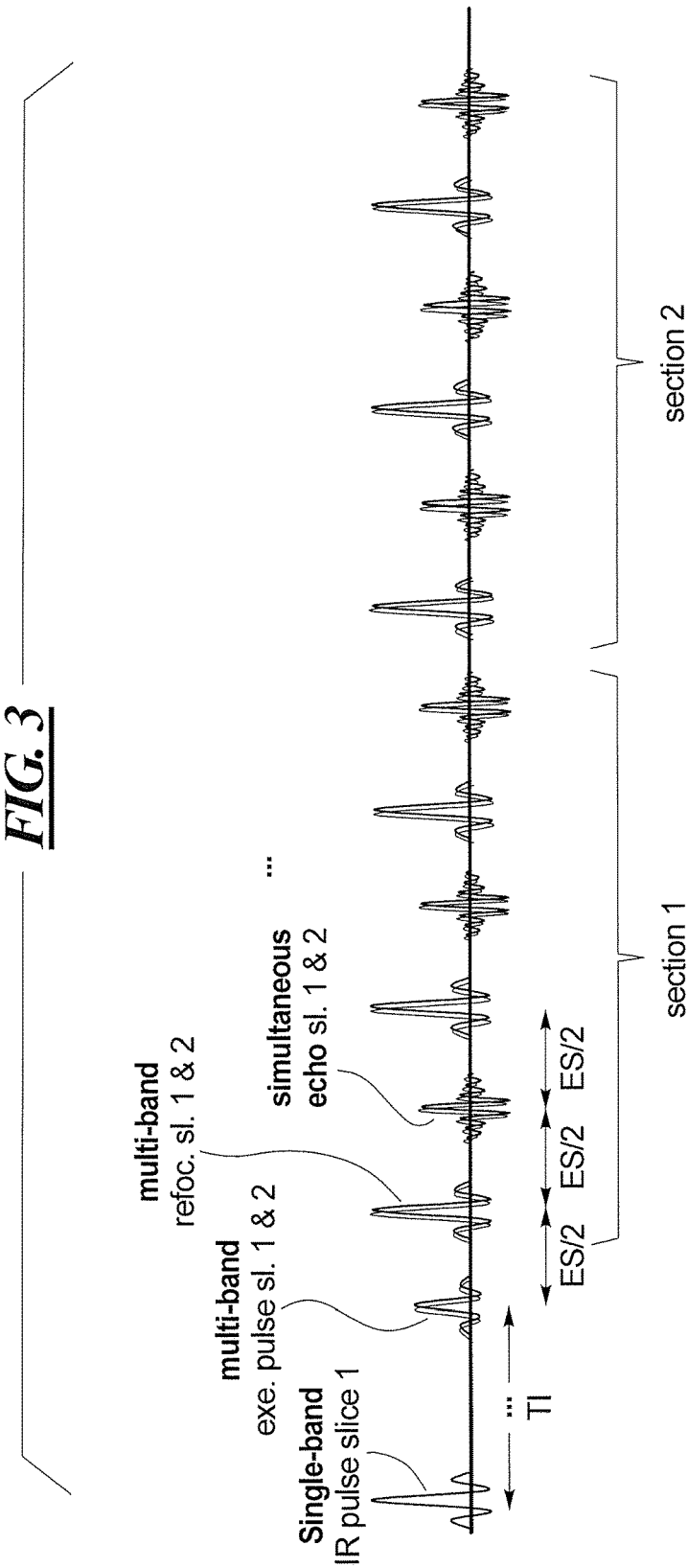
FIG. 3 schematically illustrates a first embodiment of an accelerated multi-contrast TSE sequence in accordance with the invention wherein the magnetization for a first slice is maintained using multi-band pulses.

The embodiment shown in FIG. 3 is for the purpose of acquiring raw MR data from two slices simultaneously, that are excited simultaneously, namely slice 1 and slice 2. The echo trains are divided into two sections (section 1 and section 2). The manner by which the echoes of these respective sections 1 and 2 are sorted is described below.

In the embodiment shown in FIG. 3, a FLAIR-T1 weighted contrast and a T2-weighted contrast are to be acquired within one scan. A single band IR pulse is applied to slice 1. After the inversion time T1, a multi-band pulse is radiated that excites the already-prepared slice 1 and slice 2 simultaneously. Thereafter, multiband pulses are radiated for refocusing the nuclear spins in both slice 1 and slice 2. The echoes for both slice 1 and slice 2 are read out simultaneously between the refocusing pulses. After a time period, the echo train is repeated with interchanged slices. In the embodiment shown in FIG. 3, the IR pulse is now applied to slice 2, and the aforementioned procedure is repeated.

Figure 4:
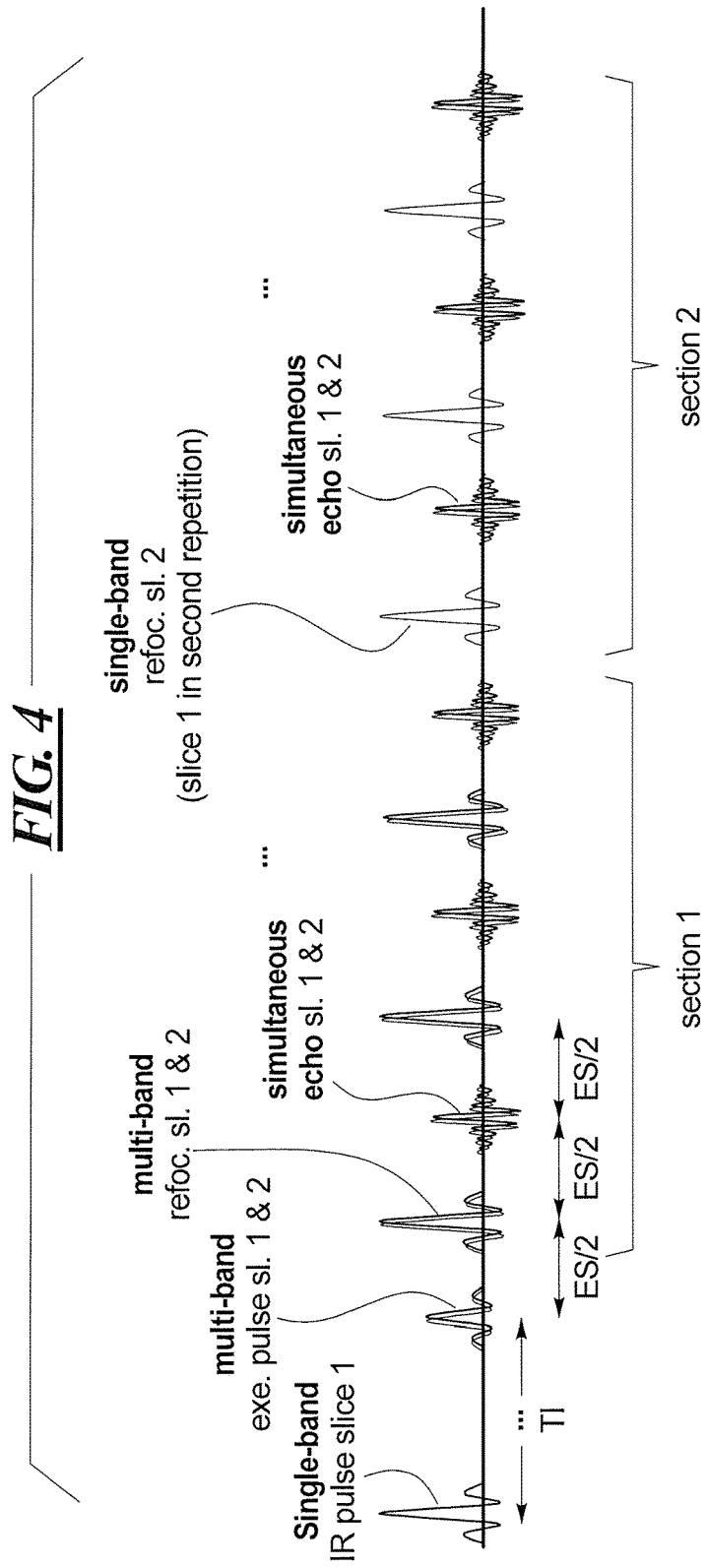
FIG. 4 schematically illustrates a second embodiment of an accelerated multi-contrast TSE sequence in accordance with the invention, wherein the magnetization in the first slice is not refocused, and instead only stimulated echoes are acquired.

The embodiment shown in FIG. 4 is identical to the embodiment shown in FIG. 3 with respect to section 1 (i.e., multi-band pulses for both slices 1 and 2). In the embodiment of FIG. 4 in section 2, however, the refocusing pulses are radiated only for slice 2. This can be helpful for reducing SAR (specific absorption rate). Echoes created for slice 1 in section 2 will then arise only from coherent echo pathways, and will exhibit an unusual but potentially useful contrast.

Figure 5:
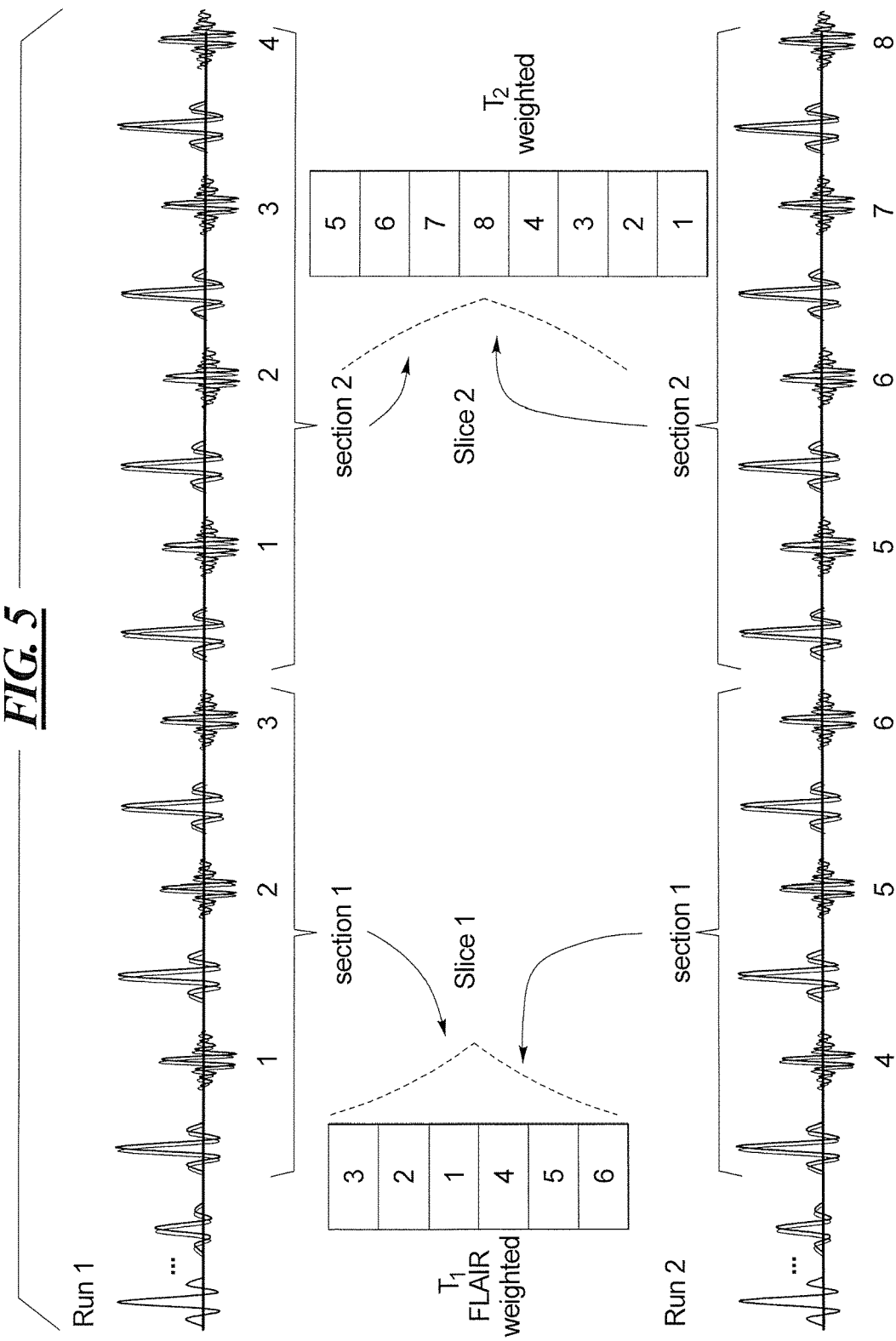
FIG. 5 shows an example for sorting the k-space segments to achieve a centric T1 FLAIR-weighted image and a reversed centric $T_2$-weighted image for different matrix sizes, respectively.

An example for sorting the echoes from sections 1 and 2 for slices 1 and 2 is shown in FIG. 5. The RF pulses and readout events are used as described in FIGS. 3 and/or 4 (i.e., the first pulse in the diagram is an single-band IR pulse, the second pulse is a multi-band excitation pulse, the third pulse as a multi-band refocusing pulse followed by an readout event which collects signal from both slices simultaneously and so on). In this example, section 1 has three echoes and section 2 has four echoes. Other combinations of numbers of echoes are possible. The respective phase-encoding gradients are not shown in FIG. 5. They are chosen to allow a sorting of the k-space lines into the different k-space segments as described below. The echo lines for slice 1 are sorted into the k-space matrix with centric ordering to form a T1 FLAIR-weighted image. The k-space matrix is composed of six segments (with segments 1 and 4, as well as 2 and 3, as well as 3 and 6, exhibiting the same recording time, respectively). These segments are filled in k-space consecutively, with echo train that is acquired. The echo lines for slice 2 are sorted in the k-space matrix in reverse centric order, to form a T2-weighted image from section 2. Because more echoes are recorded in section 2, the associated matrix exhibits more voxels than the first matrix for section 1. Both slices exhibit identical phase encoding during the echo train (i.e. centric for section 1 and reversed centric for section 2). The echoes of section 1 are utilized only for slice 1 to form the T2 FLAIR-weighted image, while the echoes of section 2 are utilized only for slice 2 to form the T2-weighted image. In this example, SMS thus serves only to keep the magnetization for slice 2 (alive) for the echoes in section 2, in order to allow for an adequate T2-weighted contrast. Therefore, multi-band pulses could be used for all RF pulses as shown in FIG. 3 or, alternatively, as in the embodiment shown in FIG. 4, only single band pulses could be applied for section 2, (e.g., to reduce the specific absorption rate.

Figure 6:
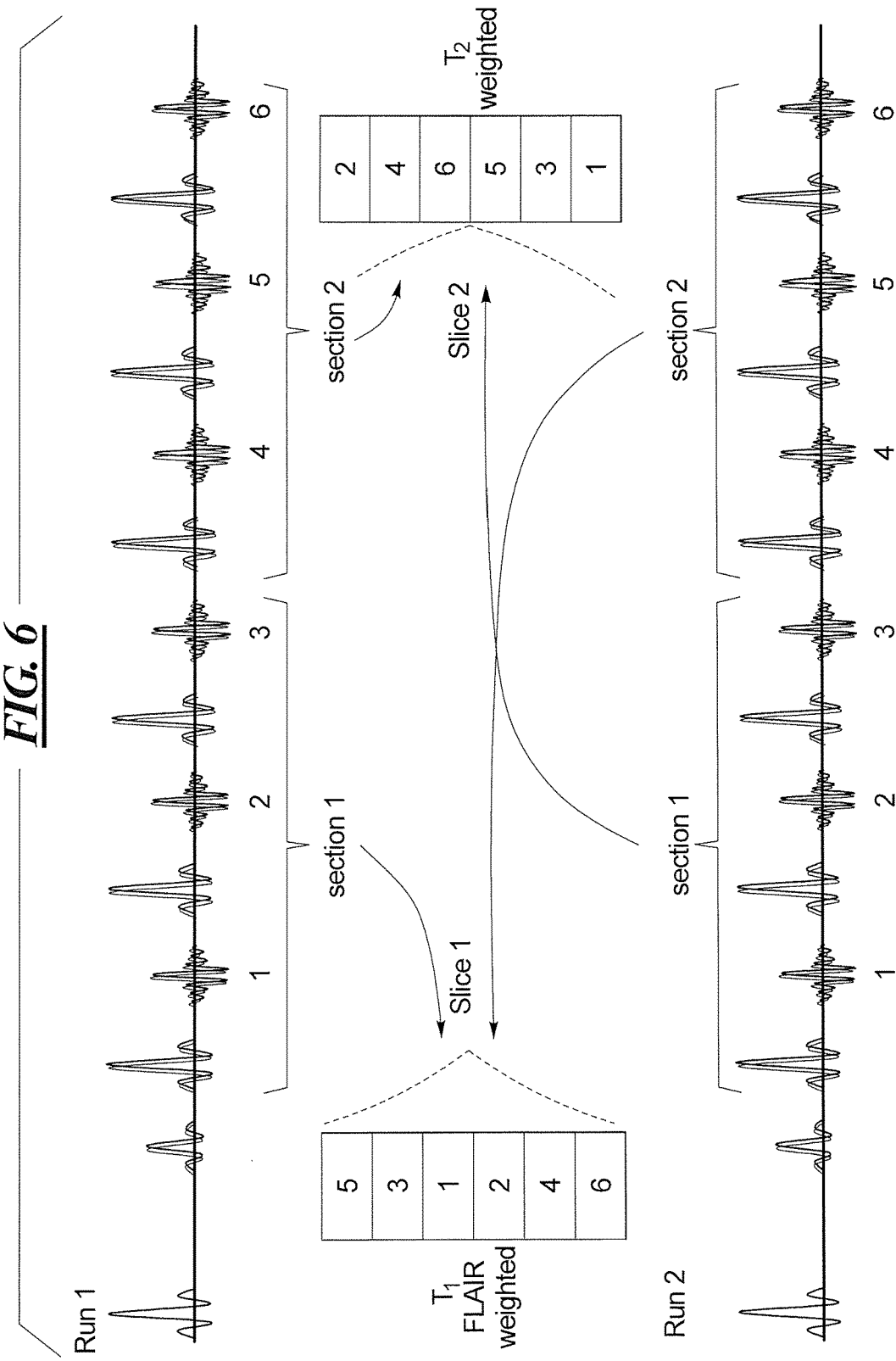
FIG. 6 shows another example for sorting the k-space segments to achieve a centric T1 FLAIR-weighted image and a reversed centric $T_2$-weighted image for identical matrix sizes, respectively.

Another sorting scheme is shown in FIG. 6 in the first execution, the early echoes of section 1 are sorted into the centric FLAIR T1-weighted matrix for slice 1, while the echoes of section 2 are sorted into the reversed centric T2-weighted matrix for slice 2. In the second execution, the early echoes are encoded with reversed centric phase encoding, and are sorted into the k-space segments with high frequency of slice 2 first, followed by the echoes of section 2 being sorted into k-space segments with high frequency of slice 1.

Figure 7:
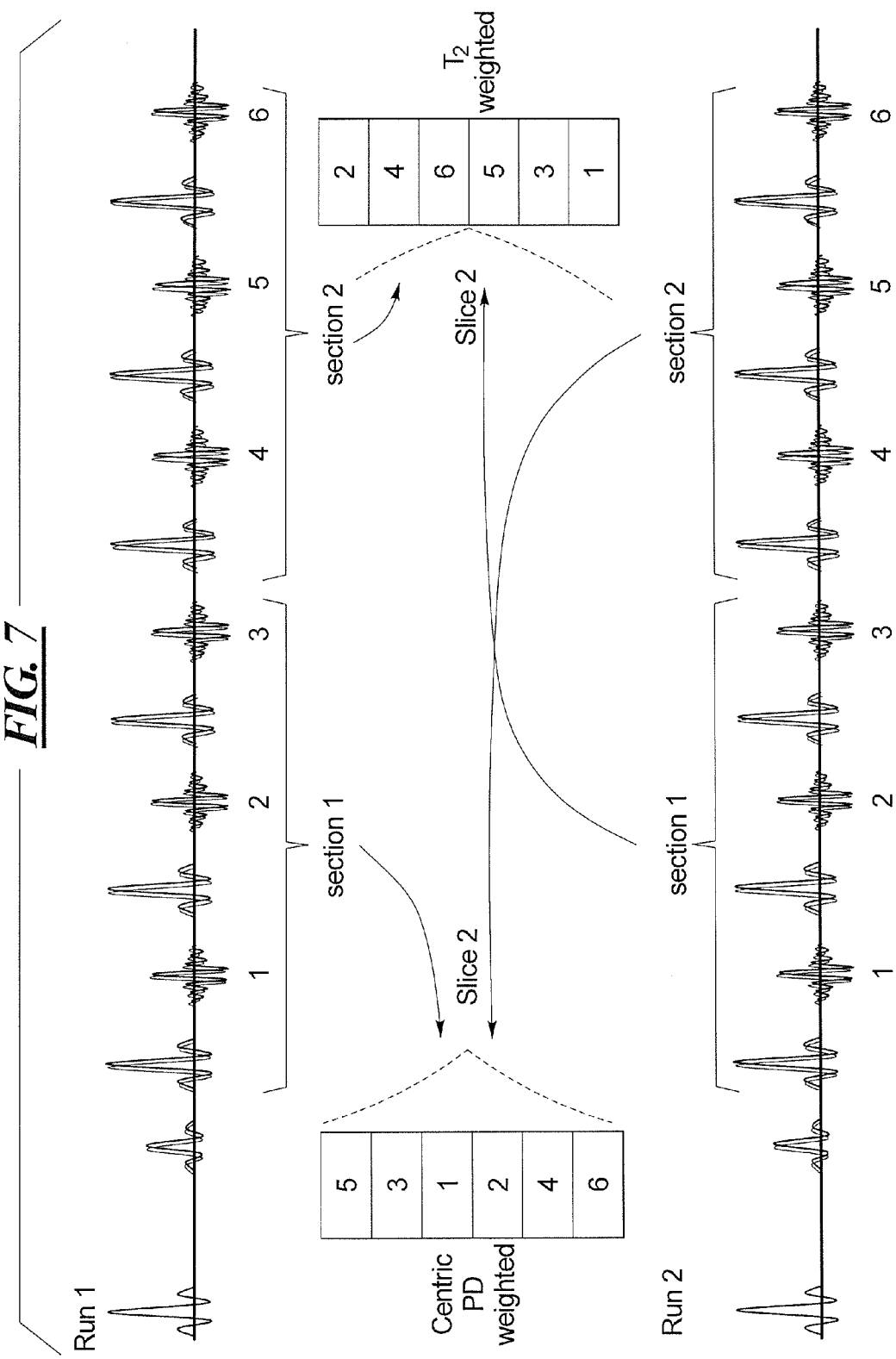
FIG. 7 shows a variance for the second slice in order to obtain one more contrast in addition to the $T_2$-weighting.

FIG. 7 illustrates an embodiment to acquire an additional centric proton-density (PD) weighted image, in addition to the T2-weighted image, for slice 2. In the embodiment shown in FIG. 7, the echoes of section 1 are sorted with identical phase encoding, as the FLAIR-T1 weighted contrast for slice 1, into an additional matrix. In the second execution, the echoes of section 2 are used to fill the centric PD weighted matrix. In this embodiment, three contrasts are acquired with one scan: FLAIR-T1 for slice 1 (as shown in FIGS. 6), and T2 (as shown in FIGS. 6 and 7), as well PD for slice 2. The same contrasts also can be acquired from the embodiment shown in FIG. 5. The remaining echoes from section 2 in the first execution, and from section 1 in the second execution, also could be used to form an additional contrast dominated by the FLAIR pulse and a T2-weighting during the readout for slice 1, thus ultimately achieving four contrasts: FLAIR-T1 and "FLAIR-T2" (noting that the T1 for the IR pulse is different here and thus the contrast will not be equal to a conventional FLAIR-T2) for slice 1, and T2 and PD for slice 2.

Figure 8:
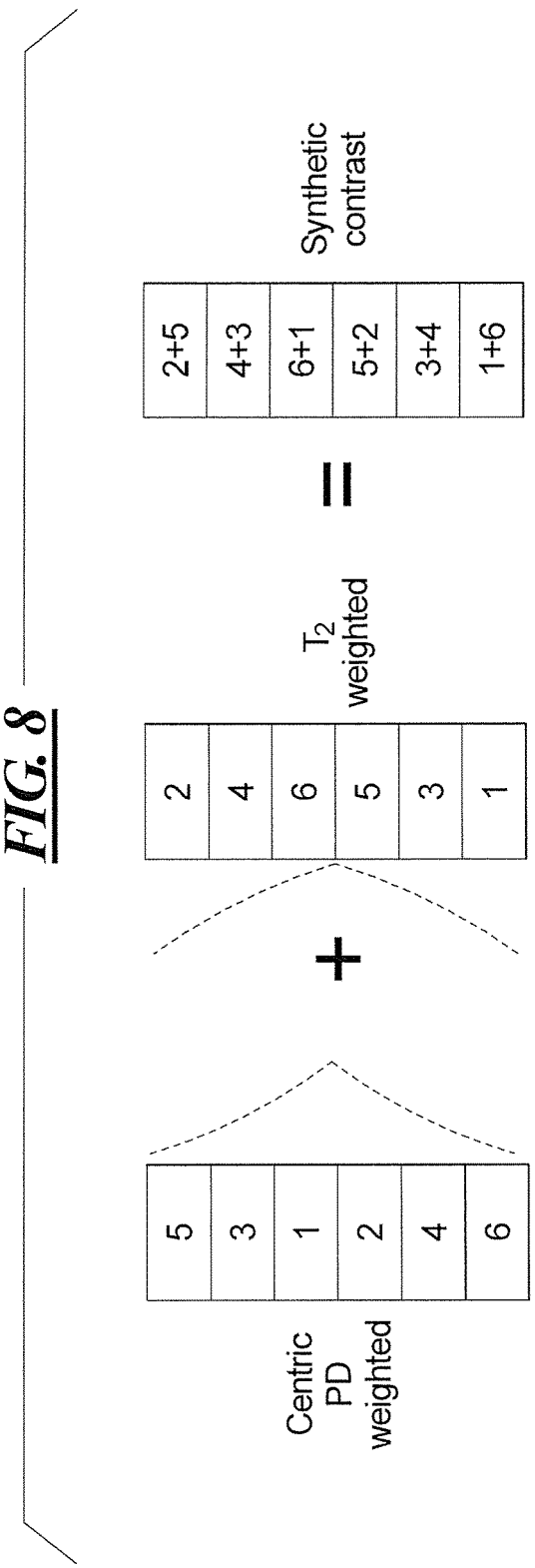
FIG. 8 shows an example for mixing the two contrasts obtained for the second slice in FIG. 6 in order to create a third artificial contrast.

Two contrasts acquired for one slice also can be combined to form a third contrast. An example is shown in FIG. 8. In FIG. 8, the centric PD contrast image is averaged with the reversed centric T2 image, in order to obtain a new synthetic contrast. Instead of adding two images, other operations such as image subtraction of weighted averaging can be implemented as well in order to foam additional contrasts.

Figure 9:
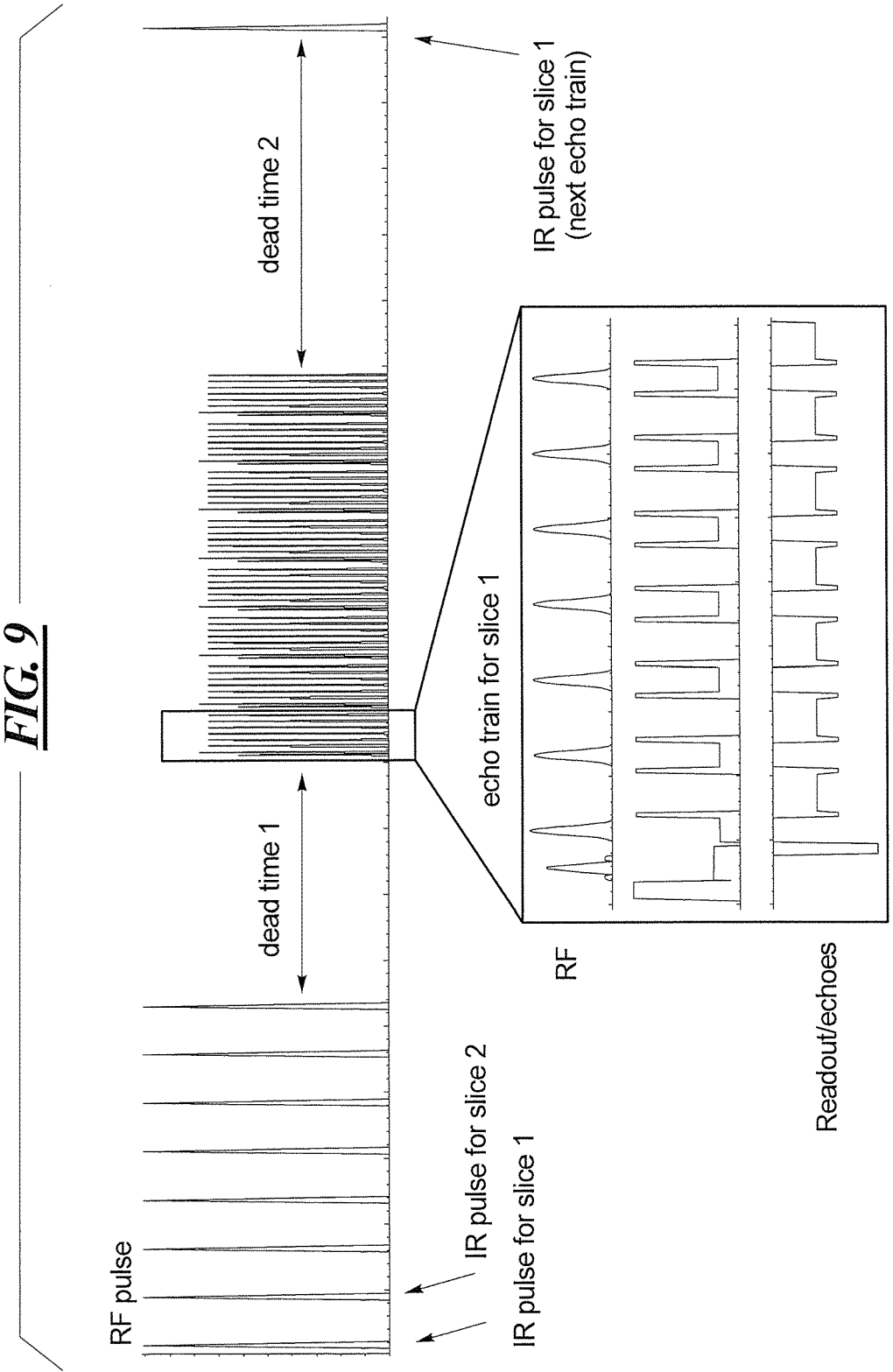
FIG. 9, as noted above, is a sequence diagram of a conventional T1-FLAIR TSE protocol.

In comparison to the conventional T1-FLAIR TSE protocol shown in FIG. 9, in the method and apparatus according to the invention the dead times are reduced by acquiring more echoes in one echo train, which are then used for the second contrast, and adequately increasing the spacing of the respective IR pulses.

In the above examples, acquisitions were described for simultaneous T1-FLAIR and T2-weighted images. The primary advantage over a consecutive acquisition of a single band T1-FLAIR and a single band T2 protocol is the more efficient use of the measurement (data acquisition) time. The T1-FLAIR scan normally exhibits a relatively long dead time between the IR and the excitation pulse, while the conventional T2 scan exhibits a relatively long TR in order to allow for T1 relaxation. By nesting or interleaving both scans, these dead times are used in accordance with the invention to acquire other contrasts.

The method and apparatus according to the invention are not limited to the specific examples of contrast combination described above, but can also be combined in other combinations. An example of another combination is T1-FLAIR and T2-FLAIR with two inversion pulses radiated at different points in time. For other combinations of contrasts (i.e., if no specific slice preparation such as IR takes place), the acquisition scheme can even be performed without SMS.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance data, comprising:
   operating a magnetic resonance data acquisition scanner to execute a turbo spin echo (TSE) data acquisition sequence with simultaneous multi-slice (SMS) imaging wherein nuclear spins in two different slices of an examination subject are simultaneously excited so as to produce respective interleaved echo trains;
   operating said magnetic resonance data acquisition scanner with said SMS imaging configured so that magnetic resonance signals from the respective slices have a different contrast, with said SMS imaging being configured to cause evolution of magnetization of the nuclear spins for a second contrast of the different contrasts while magnetic resonance signals with a first contrast of the different contrasts are being detected;
   detecting the respective magnetic resonance signals from the two different slices and entering the detected signals into an electronic memory organized as k-space, as k-space data; and
   from a computer having access to said memory, making the k-space data electronically available as a data file.

2. A method as claimed in claim 1 comprising using a T1-FLAIR protocol as said TSE protocol.

3. A method as claimed in claim 2 comprising providing said data file to an image reconstruction computer and, in said image reconstruction computer, generating a T2 weighted image and a FLAIR-T1 weighted image from said k-space data, as said different contrasts.

4. A method as claimed in claim 3 comprising sorting said k-space later to produce said T1 FLAIR weighted image as a centric T1 FLAIR weighted image and to produce said T2 weighted image as a reversed centric T2 weighted image.

5. A method as claimed in claim 4 comprising sorting said k-space data to produce said T1 FLAIR weighted image as said centric T1 FLAIR weighted image and to produce said T2 weighted image as said reversed centric T2 weighted image, for respectively different matrix sizes of said k-space data.

6. A method as claimed in claim 1 comprising sorting said k-space data to produce a further image with a further weighting.

7. A method as claimed in claim 1 comprising sorting said k-space data to fill a centric proton-density weighted matrix, and generating said image with said further weighting as a proton density weighted image.

8. A magnetic resonance imaging apparatus comprising:
   a magnetic resonance data acquisition scanner;
   a control computer configured to operate the magnetic resonance data acquisition scanner to execute a turbo spin echo (TSE) data acquisition sequence with simultaneous multi-slice (SMS) imaging wherein nuclear spins in two different slices of an examination subject are simultaneously excited so as to produce respective interleaved echo trains;
   said control computer being configured to operate said magnetic resonance data acquisition scanner with said SMS imaging configured so that magnetic resonance signals from the respective slices have a different contrast, with said SMS imaging being configured to cause evolution of magnetization of the nuclear spins for a second contrast of the different contrasts while magnetic resonance signals with a first contrast of the different contrasts are being detected;
   said control computer being configured to operate the magnetic resonance data acquisition scanner to detect the respective magnetic resonance signals from the two different slices and to enter the detected signals into an electronic memory organized as k-space, as k-space data; and
   said control computer being configured to access said memory to make the k-space data electronically available as a data file.

9. A magnetic resonance apparatus as claimed in claim 8 wherein said control computer is configured to operate the magnetic resonance data acquisition scanner to use a T1-FLAIR protocol as said TSE protocol.

10. A magnetic resonance apparatus as claimed in claim 9 comprising an image reconstruction computer provided with data files, said image reconstruction computer being configured to generate a T2 weighted image and a FLAIR-T1 weighted image from said k-space data, as said different contrasts.

11. A magnetic resonance apparatus as claimed in claim 10 wherein said image reconstruction computer is configured to sort said k-space later to produce said T1 FLAIR weighted image as a centric T1 FLAIR weighted image and to produce said T2 weighted image as a reversed centric T2 weighted image.

12. A magnetic resonance apparatus as claimed in claim 11 wherein said mage reconstruction computer is configured to sort said k-space data to produce said T1 FLAIR weighted image as said centric T1 FLAIR weighted image and to produce said T2 weighted image as said reversed centric T2 weighted image, for respectively different matrix sizes of said k-space data.

13. A magnetic resonance apparatus as claimed in claim 8 wherein said mage reconstruction computer is configured to sort said k-space data to produce a further image with a further weighting.

14. A magnetic resonance apparatus as claimed in claim 8 wherein said mage reconstruction computer is configured to sort said k-space data to fill a centric proton-density weighted matrix, and generating said image with said further weighting as a proton density weighted image.

15. A magnetic resonance apparatus as claimed in claim 8 wherein said control computer is configured to operate said magnetic resonance data acquisition unit by radiating, in said SMS imaging, an inversion pulse that acts on only one of the simultaneously excited slices.

16. A method as claimed in claim 1 comprising operating said magnetic resonance data acquisition scanner in said SMS imaging by radiating an inversion pulse that acts on only one of the simultaneously excited slices.

\* \* \* \* \*